United States Patent
Zhu et al.

(10) Patent No.: US 10,249,422 B2
(45) Date of Patent: Apr. 2, 2019

(54) FRONT-MAINTAINED MULTILAYER MAGNETIC-ATTACHING LED DISPLAY SCREEN WITH SMALL PITCH

(71) Applicant: NANJING LUOPU TECHNOLOGY CO., LTD, Nanjing (CN)

(72) Inventors: Bin Zhu, Nanjing (CN); Jorge Perez Bravo, Norcross, GA (US)

(73) Assignee: NANJING LUOPU TECHNOLOGY CO., LTD, Nanjing (CN)

( * ) Notice: Subject to any disclaimer, the term of this patent is extended or adjusted under 35 U.S.C. 154(b) by 0 days.

(21) Appl. No.: 15/766,834

(22) PCT Filed: Jan. 29, 2016

(86) PCT No.: PCT/CN2016/072687
§ 371 (c)(1),
(2) Date: Apr. 9, 2018

(87) PCT Pub. No.: WO2017/063319
PCT Pub. Date: Apr. 20, 2017

(65) Prior Publication Data
US 2019/0066894 A1    Feb. 28, 2019

(30) Foreign Application Priority Data
Oct. 14, 2015    (CN) .......................... 2015 1 0667002

(51) Int. Cl.
*H05K 5/00* (2006.01)
*H05K 7/00* (2006.01)
(Continued)

(52) U.S. Cl.
CPC ............... *H01F 7/02* (2013.01); *G09F 9/302* (2013.01); *H05K 1/111* (2013.01); *H05K 1/144* (2013.01);
(Continued)

(58) Field of Classification Search
CPC . G06F 1/1601; G06F 1/1603; H05K 7/20509; H05K 7/20254; H05K 7/205;
(Continued)

(56) References Cited

U.S. PATENT DOCUMENTS 8,687,371 B2 *   4/2014   Arshad et al. .......... G06F 21/86
                                                               361/737
2011/0096568 A1   4/2011   Schattinger et al.
(Continued)

FOREIGN PATENT DOCUMENTS

CN    201655193 U    11/2010
CN    202601108 U    12/2012
(Continued)

*Primary Examiner* — Binh B Tran
(74) *Attorney, Agent, or Firm* — Gokalp Bayramoglu

(57) ABSTRACT

The present invention relates to a front-maintained multilayer magnetic-attaching LED display screen with small pitch. The structure of the present invention includes a planar array driving board containing light emitting diodes, pads having fixed interval are arranged around the planar array driving board, and the planar array driving board is fixedly connected to a first mounting board of a central fixed iron board to form a module. The module and the second mounting board are magnetically attached to form an outer layer magnetic-attaching structure, and the second mounting board are magnetically attached to the box or mounting member to form an inner layer magnetic-attaching structure; the magnetic force of the outer layer magnetic-attaching is smaller than that of the inner layer magnetic-attaching structure; a module assembly including at least two modules is magnetically attached by the box body or the mounting member.

8 Claims, 3 Drawing Sheets

(51) Int. Cl.

| | |
|---|---|
| *H05K 1/18* | (2006.01) |
| *H01F 7/02* | (2006.01) |
| *H05K 1/11* | (2006.01) |
| *H05K 1/14* | (2006.01) |
| *G09F 9/302* | (2006.01) |
| *G06F 1/16* | (2006.01) |
| *H05K 7/02* | (2006.01) |
| *H05K 7/20* | (2006.01) |

(52) U.S. Cl.
CPC ........... H05K 1/181 (2013.01); H05K 5/0017 (2013.01); *G06F 1/1601* (2013.01); *H05K 7/023* (2013.01); *H05K 7/20254* (2013.01); *H05K 7/20509* (2013.01); *H05K 2201/042* (2013.01); *H05K 2201/09409* (2013.01); *H05K 2201/10106* (2013.01)

(58) Field of Classification Search
CPC ................. H05K 5/0021; H05K 7/023; H05K 2201/043; H05K 2201/10515
See application file for complete search history.

(56) References Cited

U.S. PATENT DOCUMENTS

2013/0301202 A1\* 11/2013 Fowler .................. G06F 1/1684
  361/679.21
2015/0282334 A1\* 10/2015 Yamamoto ........ G02F 1/133308
  362/97.1

FOREIGN PATENT DOCUMENTS

| CN | 104269116 A | 1/2015 |
| CN | 104882073 A | 9/2015 |
| CN | 105528968 A | 4/2016 |

\* cited by examiner

FRONT-MAINTAINED MULTILAYER MAGNETIC-ATTACHING LED DISPLAY SCREEN WITH SMALL PITCH

CROSS REFERENCE TO RELATED APPLICATIONS

This application is the national phase entry of International Application PCT/CN2016/072687, filed on Jan. 29, 2016, which is based upon and claims priority to Chinese Patent Application No. 201510667002.0, filed on Oct. 14, 2015, the entire contents of which are incorporated herein by reference.

TECHNICAL FIELD

The present invention relates to a small-pitch LED display screen, particularly to a front-maintained multilayer magnetic-attaching LED display screen with small pitch, belonging to the technical field of LED devices.

BACKGROUND

LED display screens have been widely used due to energy conservation and environment protection. Especially the small-pitch display screens with a dot pitch of less than 3 mm have a growing market demand due to the advantages of bright colors, high resolution, seamless splicing, and ultra-quietness. Recently, the magnetic-attaching LED display screens with small pitch which can be maintained at front side uses single-module attachment at home and abroad, and then a plurality of modules are directly attached on a box body or a mounting member through a magnetic steel seat. In order to meet the requirements for actual assembly and disassembly, the magnetic force of the present magnetic-attaching LED display screens with small pitch which can be maintained at front side is smaller. After large LED screen is assembled, because of the small offset and mutual extrusion of the magnetic-attaching module, non-adjustable and unrepairable degree of smoothness and module gaps with different sizes brought by repeated assemblies during maintenance will be caused. In order to avoid the small offset and extrusion of the installed magnetic-attaching module with small magnetic force, the installed magnetic-attaching module are fixedly attached on the box or the mounting member, but due to the non-adjustment of the installed magnetic-attaching module, in practical applications, the accumulated error caused by related mounting members such as a mounting structure or a mounting plane cannot be effectively solved, and the smoothness and the module gaps cannot be well guaranteed.

SUMMARY

The present invention aims at the defects existing in the prior art and proposes a front-maintained multilayer magnetic-attaching LED display screen with small pitch, the installation is convenient, the smoothness and module gaps of the small-pitch LED display screen can be ensured, and the front-maintained multilayer magnetic-attaching LED display screen with small pitch can be installed and overhauled on the front side.

The present invention solves technical problems through the following technical solutions: a front-maintained multilayer magnetic-attaching LED display screen with small pitch, including a planar array driving board containing light emitting diodes, pads having fixed interval are arranged around the planar array driving board, the planar array driving board is fixedly connected to a first mounting board of a central fixed iron board to form a module, the module and a second mounting board are magnetically attached to form an outer layer magnetic-attaching structure, the second mounting board is magnetically attached by a box body or a mounting member to form an inner layer magnetic-attaching structure; a magnetic force of the outer layer magnetic-attaching structure is smaller than that of the inner layer magnetic-attaching structure; a module assembly consisting of at least two modules is magnetically attached by the box body or the mounting member.

The present invention is suitable for a small-pitch display screen with a dot pitch less than 3 mm. When above structure is adopted, the module is fixed on the second mounting board by the low-magnetic outer layer magnetic-attaching structure, and the assembly and disassembly are convenient; the module assembly is fixed on the box body or the mounting member through the high-magnetic inner layer magnetic-attaching structure, and the installation is convenient.

A size of a light emitting diode is less than 2.5 mm×2.5 mm×2.0 mm, and the light emitting diodes are mounted in array to form a pixel matrix of M rows×N columns, among them, M and N are positive integers. An overall dimension of the module is smaller than 700 mm×700 mm. The module has three primary colors, two primary colors, or a single primary color. The module is a single-board, a double-board or at least a triple-board. A circuit board of the module is a single-layer board, a double-layer board or at least a triple-layer board.

Further, the magnetic-attaching structure of the module has N layers, and N≥2; when N=2, the magnetic-attaching structure layers are composed of the outer layer magnetic-attaching structure and the inner layer magnetic-attaching structure, when N>2, the magnetic-attaching structure is formed by setting a third mounting board between the outer layer magnetic-attaching structure and the inner layer magnetic-attaching structure. The third mounting board is a magnetic-attaching layer and is connected to the module and the second mounting board through a connector containing a magnetic core.

In the present invention, the smoothness and the module gaps of the display screen are ensured by adjusting the magnetic steel seat. Since the magnetic force of the outer layer magnetic-attaching structure is smaller than that of the inner layer magnetic-attaching structure, when the module needs to be repaired, the module with smaller magnetism is sucked out through the module special osculum. If the internal system has problems, the second mounting board with lager magnetism can be removed by the tool or by using the power of hand, and the maintenance at the front side can be performed. The advantages are as follows: by the means of setting different magnetic force absorption, the problem of small offset and extrusion of the installed magnetic-attaching module with small magnetic force is solved, and the problem that the degree of smoothness and the module gaps cannot be adjusted caused by the module fixed on the box body or the mounting member may also be solved, the concept is ingenious, the assembly and disassembly are convenient.

DETAILED DESCRIPTION

Embodiment 1

The structure of this embodiment is shown in FIG. 1 to FIG. 4, a front-maintained multilayer magnetic-attaching LED display screen with small pitch, including a planar array driving board 2-1 containing light emitting diodes, and the size of the light emitting diodes 2-8 is smaller than 2.5 mm×2.5 mm×2.0 mm, light emitting diodes are mounted in an array to form a pixel matrix of M rows×N columns, where M and N are positive integers. Pads 2-2 with a fixed interval are arranged around the planar array driving board 2-1, and the planar array driving board 2-1 is fixedly connected to the first mounting board 2-4 of the central fixed iron plate 2-3 to constitute a module 2. The overall dimension of the module 2 is smaller than 700 mm×700 mm. The module 2 has three primary colors, two primary colors, or a single primary color. The module 2 is a single-board, a double-board, or at least a triple-board. The circuit board of the module is a single-layer board, a double-layer board or at least a triple-layer boards. The surface of the first mounting board is lower than that of the module pad. The magnetic-attaching structure layer of the module used in this embodiment has two layers, and the module and the second mounting board 2-5 are magnetically attached, the connector 2-6 with small magnetic core may be mounted on the second mounting board 2-5, or may be mounted on the first mounting board 2-4 to form an outer layer magnetic-attaching structure, and the long screws are fixed to the periphery of the second mounting board 2-5 by washers and nuts, then the magnetic steel seat 2-7 having a large magnetic core is fixed on the long screw and fixedly connected to the second mounting board 2-5 to form the inner layer magnetic-attaching structure; the magnetic force of the outer layer magnetic-attaching structure is smaller than that of the inner layer magnetic-attaching structure; the module assembly composed of two modules is magnetically attached to (box or mounting member) 1. The embodiment is suitable for a small-pitch display screen with a dot pitch less than 3 mm. When above is adopted, the module is fixed on the second mounting board by the low-magnetic outermost layer magnetic-attaching structure, and the assembly and disassembly are convenient; the module assembly is fixed on the box body or the mounting member through the inner layer magnetic-attaching structure, and the installation is convenient. When the module is disassembled, it is merely necessary to attach to surface of the module by the suction force of the iron plate 2-3 using the module special osculum having magnetism, and suck out the module, and then remove the overall second mounting board with larger magnetism by the tool or by using the power of hand to perform maintenance.

Embodiment 2

Figure 1:
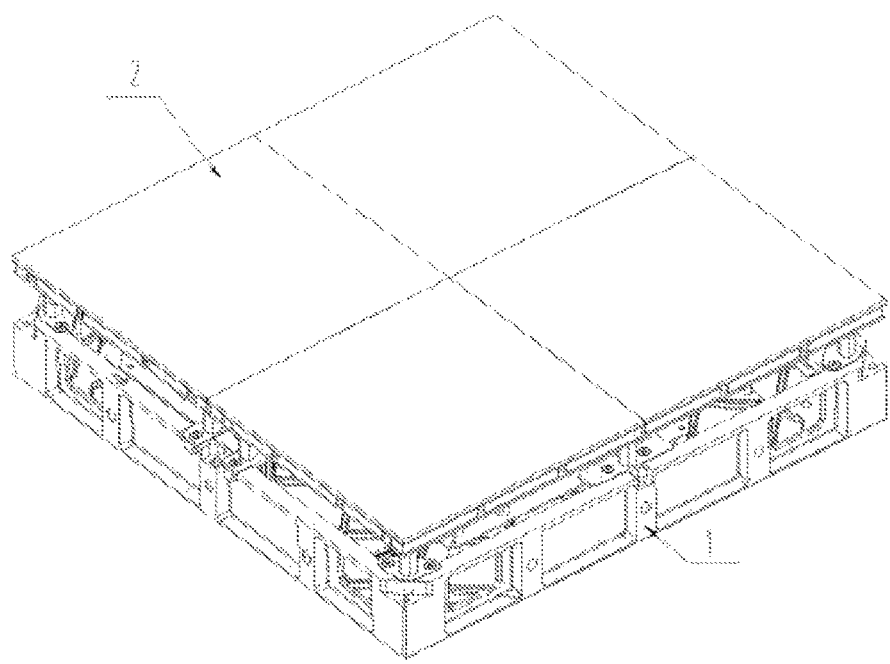
FIG. 1 is a structural schematic perspective diagram according to an embodiment of the present invention.
Figure 2:
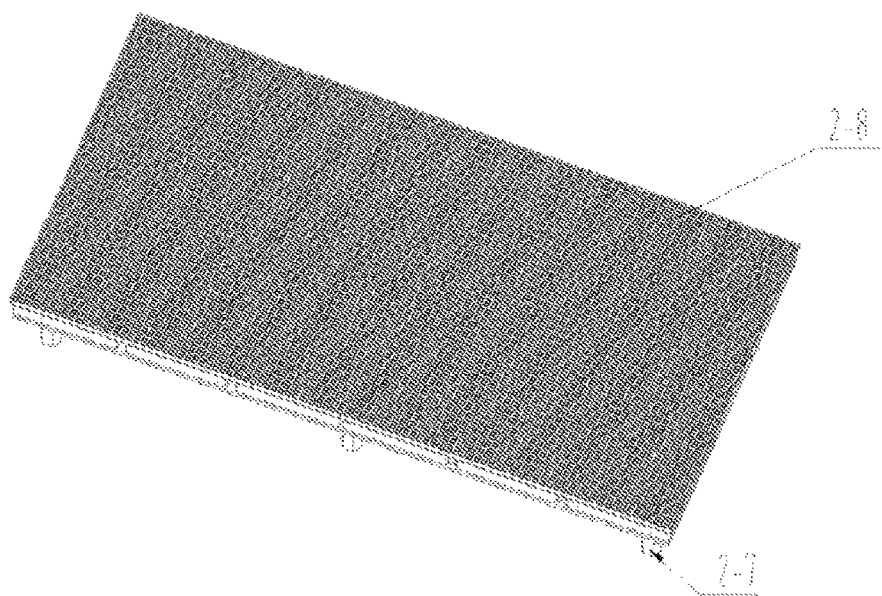
FIG. 2 is a perspective schematic diagram of the module containing the light emitting diode in FIG. 1.
Figure 3:
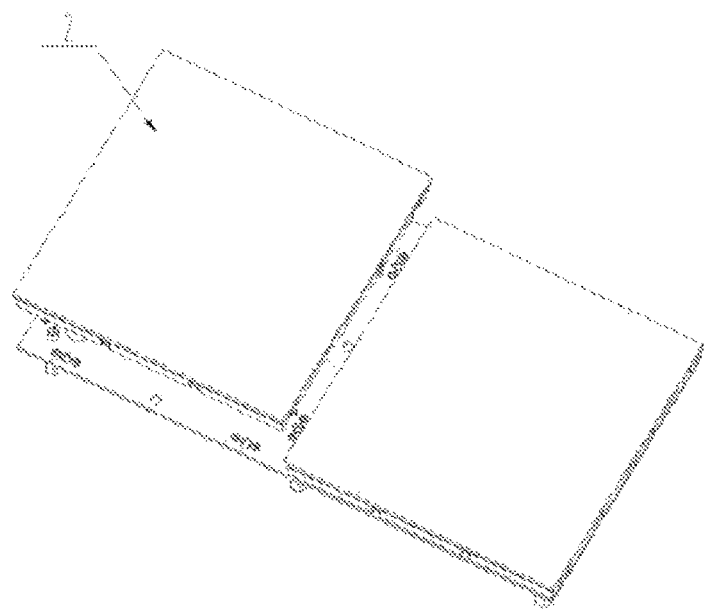
FIG. 3 is a perspective schematic diagram of the module without light emitting diode in FIG.
Figure 4:
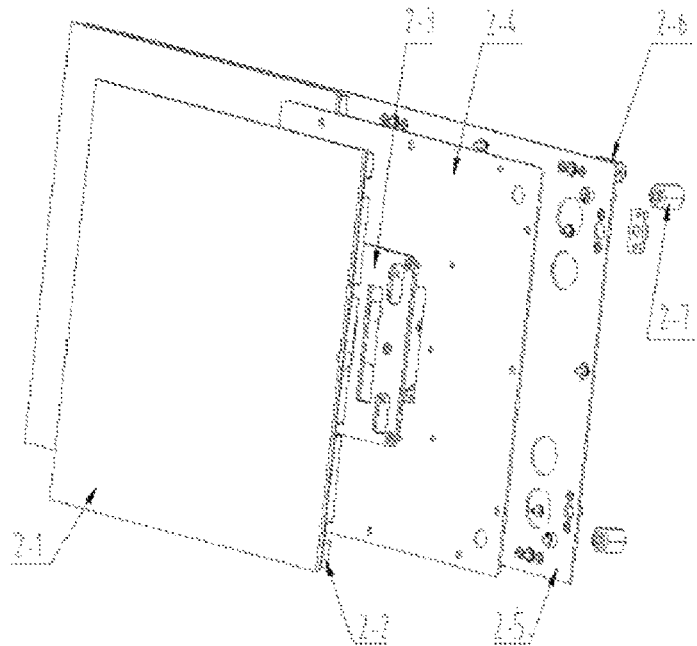
FIG. 4 is an explosive view of the module assembly in FIG. 1.
Figure 5:
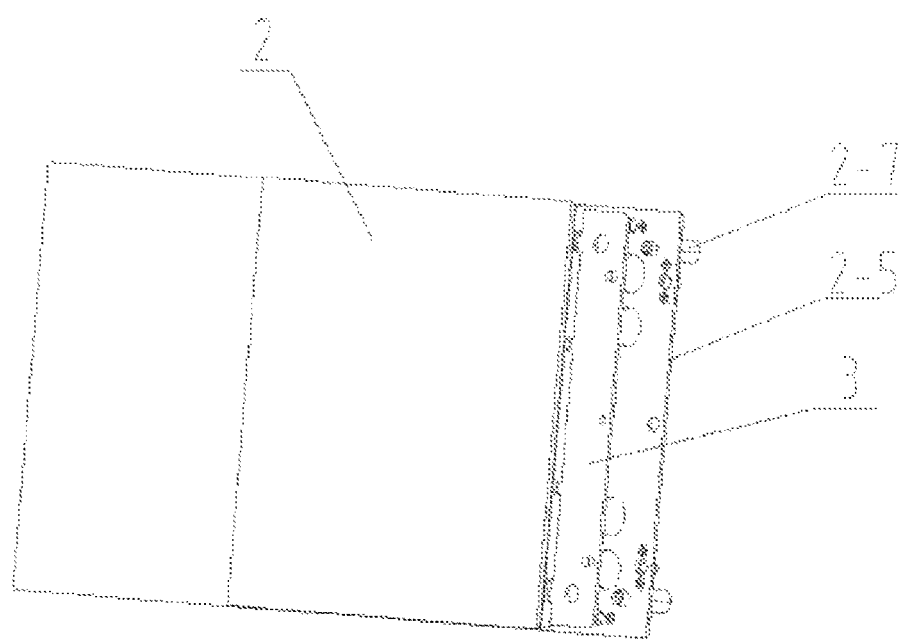
FIG. 5 is a structural schematic diagram of the module assembly according to another embodiment of the present invention.

As shown in FIG. 5, the structure of the present embodiment is substantially the same as that of the embodiment 1, except that the module is a three-layer magnetic-attaching structure in the present embodiment, i.e. a third mounting board 3 is attached by the magnetic force between the module and the second mounting board. The third mounting board 3 is connected to the module and the second mounting board through a connector containing a magnetic core.

Except the above mentioned implementations, the present invention may have other embodiments. For example, the number of layers of the magnetic-attaching structure layer of the module, the placement position of the connector and the magnetic-attaching position of the magnetic steel seat, etc. All technical solutions formed by adopting equivalent replacement or equivalent transformation fall within the protection scope of the present invention.

We claim:

1. A front-maintained multilayer magnetic-attaching LED display screen with small pitch, comprising:
    a planar array driving board comprising a plurality of light emitting diodes; wherein
    a plurality of pads having fixed interval are arranged around the planar array driving board, and the planar array driving board is fixedly connected to a first mounting board of a central fixed iron board to form a module;
    the module and a second mounting board are magnetically attached to form an outer layer magnetic-attaching structure;
    the second mounting board is magnetically attached to a box body or a mounting member to form an inner layer magnetic-attaching structure;
    a first magnetic force of the outer layer magnetic-attaching structure is smaller than a second magnetic force of the inner layer magnetic-attaching structure;
    a module assembly comprising at least two of the modules is formed by magnetically attaching the at least two of the modules to the box body or the mounting member.

2. The front-maintained multilayer magnetic-attaching LED display screen with small pitch according to claim 1, wherein
    a size of each of the plurality of light emitting diodes is smaller than 2.5 mm×2.5 mm×2.0 mm, and the plurality of light emitting diodes are mounted in an array to form a pixel matrix of M rows×N columns,
    M and N are positive integers.

3. The front-maintained multilayer magnetic-attaching LED display screen with small pitch according to claim 1, wherein
    an overall dimension of the module is smaller than 700 mm×700 mm.

4. The front-maintained multilayer magnetic-attaching LED display screen with small pitch according to claim 1, wherein
    the module comprises three primary colors, two primary colors or a single primary color.

5. The front-maintained multilayer magnetic-attaching LED display screen with small pitch according to claim 1, wherein
    the module is a single-board, a double-board or at least a triple-board.

6. The front-maintained multilayer magnetic-attaching LED display screen with small pitch according to claim 1, wherein
    a circuit board of the module is a single-layer board, a double-layer board or at least a three-layer board.

7. The front-maintained multilayer magnetic-attaching LED display screen with small pitch according to claim 1, wherein a magnetic-attaching structure layer of the module comprises N layers, N≥2; when N=2, the magnetic-attaching structure layer is composed of the outer layer magnetic-attaching structure and the inner layer magnetic-attaching structure, when N>2, the magnetic-attaching structure layer is formed by the outer layer magnetic-attaching structure, the inner layer magnetic-attaching structure and a third mounting board magnetically attached between the module and the second mounting board.

8. The front-maintained multilayer magnetic-attaching LED display screen with small pitch according to claim 7, wherein the third mounting board is connected to the module and the second mounting board through a connector, the connector comprises a magnetic core.

* * * * *

UNITED STATES PATENT AND TRADEMARK OFFICE
CERTIFICATE OF CORRECTION

PATENT NO. : 10,249,422 B2  
APPLICATION NO. : 15/766834  
DATED : April 2, 2019  
INVENTOR(S) : Bin Zhu et al.

It is certified that error appears in the above-identified patent and that said Letters Patent is hereby corrected as shown below:

On the Title Page

Item (73) The assignee should read (--NANJING LOPU TECHNOLOGY CO., LTD--) instead of NANJING LUOPU TECHNOLOGY CO., LTD.

Signed and Sealed this
Tenth Day of March, 2020

Andrei Iancu
*Director of the United States Patent and Trademark Office*